(12) United States Patent
Ema et al.

(10) Patent No.: US 6,664,174 B2
(45) Date of Patent: Dec. 16, 2003

(54) SEMICONDUCTOR DEVICE AND METHOD FOR FABRICATING THE SAME

(75) Inventors: Taiji Ema, Kawasaki (JP); Edward J. Swenson, Portland, OR (US); Thomas W. Richardson, Portland, OR (US); Yunlong Sun, Portland, OR (US)

(73) Assignees: Fujitsu Limited, Kawasaki (JP); Electro Scientific Industries Incorporated, Portland, OR (US)

( * ) Notice: Subject to any disclaimer, the term of this patent is extended or adjusted under 35 U.S.C. 154(b) by 0 days.

(21) Appl. No.: 09/928,489

(22) Filed: Aug. 14, 2001

(65) Prior Publication Data

US 2002/0005551 A1 Jan. 17, 2002

Related U.S. Application Data

(62) Division of application No. 09/238,171, filed on Jan. 28, 1999, now Pat. No. 6,297,541.

(30) Foreign Application Priority Data

Jun. 1, 1998 (JP) .......................... 10-151309

(51) Int. Cl.⁷ .......................... H01L 21/44; H01L 21/82
(52) U.S. Cl. .......................... 438/601; 438/132; 438/215
(58) Field of Search .......................... 257/202, 206–209, 257/665, 758; 438/128–133, 215, 601

(56) References Cited

U.S. PATENT DOCUMENTS

| | | | | |
|---|---|---|---|---|
| 4,853,758 A | | 8/1989 | Fischer | 357/51 |
| 4,894,115 A | | 1/1990 | Eichelberger et al. | 156/643 |
| 5,593,606 A | * | 1/1997 | Owen et al. | 219/121.71 |
| 5,851,903 A | * | 12/1998 | Stamper | 438/467 |
| 5,933,714 A | * | 8/1999 | Froehner | 438/132 |
| 5,986,319 A | * | 11/1999 | Huggins | 257/529 |
| 6,177,714 B1 | * | 1/2001 | Nagai | 257/529 |

* cited by examiner

*Primary Examiner*—Matthew Smith
*Assistant Examiner*—Calvin Lee
(74) *Attorney, Agent, or Firm*—Armstrong, Westerman & Hattori, LLP

(57) ABSTRACT

The semiconductor device includes a blocking layer 12 formed on a substrate 10, an insulation film 14 formed on the blocking layer 12, and a fuse 22 formed on the insulation film 14. The blocking layer 12 is formed below the fuse 22, whereby the fuse is disconnected by laser ablation, and the laser ablation can be stopped by the blocking layer 12 with good controllability without damaging the substrate. The fuses to be disconnected can be arranged at a very small pitch, which can improve integration of the fuse circuit.

12 Claims, 12 Drawing Sheets

SEMICONDUCTOR DEVICE AND METHOD FOR FABRICATING THE SAME

This application is a division of prior application Ser. No. 09/238,171 filed Jan. 28, 1999, issued as U.S. Pat. No. 6,297,541.

BACKGROUND OF THE INVENTION

The present invention relates to a semiconductor device including a fuse circuit which can be disconnected by laser ablation and a method for fabricating the semiconductor device, and a laser system suitable to disconnect a fuse of the semiconductor device.

Semiconductor devices, such as memory devices of DRAMs, SRAMs, etc., logic devices, etc., are constituted by a very large number of elements, and a part of the circuit or of the memory cells are often inoperative due to various cause in their fabrication processes. In this case, when semiconductor devices partially defective circuits or memory cells are generally regarded as defective devices, the semiconductor devices have low fabrication yields, which might lead to fabrication cost increase. In view of this, recently such defective semiconductor devices have defective circuits or defective memory cells replaced by redundant circuits or redundant memory cells which have been prepared in advance, to create properly functioning devices. In some semiconductor devices, a plurality of circuits having functions different from each other are formed integrated and later those of certain functions are replaced, and in other semiconductor devices prescribed circuits are formed, and later characteristics of the semiconductor devices are adjusted. In such reconstruction of semiconductor devices, usually a fuse circuit having a plurality of fuses is formed on the semiconductor devices, and after operation tests, etc., the fuses are disconnected by laser beam irradiation.

A conventional semiconductor device including a fuse circuit and a method for fabricating the same will be explained with reference to FIGS. 11A–11C. FIG. 11A is a diagrammatic sectional view of the conventional semiconductor device, which shows a structure thereof. FIG. 11B is a plan view of the conventional semiconductor device, which shows the structure thereof. FIG. 11C is a diagrammatic sectional view of the conventional semiconductor device with a fuse disconnected, which shows the structure thereof.

A fuse 202 is formed on a substrate 200, connected to a prescribed circuit for replacing the circuit. An inter-layer insulation film 204 for covering the fuse 202 is formed thereon. An interconnection layer 206 is formed on the inter-layer insulation film 204, connected to the fuse 202 therethrough. A passivation film 211 is formed on the interconnection layer 206. A part of the passivation film 211 on the fuse 292 is removed. A plurality of the fuses 202 are formed on the substrate 200 at a prescribed pitch (FIGS. 11A and 11B).

To disconnect the fuse 202 in such fuse circuit, a laser beam 208 is irradiated to a region where the fuse is formed, whereby the fuse 202 is rapidly heated by its absorbed energy to a high temperature and undergoes laser explosion (FIG. 11C).

Here to further micronize the semiconductor device, it is necessary to further decrease a pitch between the fuses 202, but a pitch P of the fuses 202 is determined by a spot size 210 of the laser beam 208 and alignment accuracy of the laser beam 208.

A spot size of the laser beam 208 has a lower limit which is determined by a wavelength of the laser beam 208, and the spot size 208 can be decreased as the laser beam has a shorter wavelength. However, when a wavelength of the laser beam is too short, there is a risk that the laser beam may pass through a region where the fuse 202 is not formed, arrives at the base semiconductor substrate and is absorbed therein, and cause thermal laser explosion. In a case that the semiconductor substrate is silicon, the laser beam has an about 1 $\mu$m wavelength, at which silicon substrates absorb small amounts of laser beams. That is, a lower limit is about 1.5–2.0 $\mu$m in spot size.

On the other hand, alignment accuracy is required for the prevention of a disadvantage that the base silicon substrate is damaged if the laser explosion regions overlap each other in blowing both fuses 202 adjacent to each other and also for the prevention of a disadvantage that in disconnecting one of fuses 202 adjacent to each other, the other is damaged or blown. Usually a lower limit of the alignment accuracy is about 0.5 $\mu$m.

Thus, a lower limit of the fuse pitch of the above-described conventional fuse disconnecting method is about 2.0–2.5 $\mu$m.

As a method for narrowing a pitch P of the fuses, a party of the applicants of the present application has proposed a method using a photoresist.

In the method using a photoresist, a photoresist 212 is formed on a semiconductor device shown in FIG. 11A (FIG. 12A), a laser beam 208 whose power is low enough not to cause laser explosion is irradiated to expose the photoresist 212 (FIG. 12B), the exposed photoresist 212 is developed to remove the photoresist 212 in the exposed region 214 (FIG. 12C, and a fuse 202 is removed by the usual etching process with the photoresist 212 as a mask (FIG. 12D).

According to this method, the laser beam 208 may have a power which is sufficient only to expose the photoresist 212, and it is not necessary that the power is high enough to laser explode the fuse 202 or the semiconductor substrate. Accordingly, the laser beam 208 can easily have a shorter wavelength and can have a spot size 210 which is decreased in accordance with a wavelength of the laser beam 208. Accordingly, a fuse pitch P, which is determined by a spot size 210 of the laser beam can be decreased.

However, the method using a photoresist must additionally include a photoresist application step and a photoresist development step, a fuse etching step and a photoresist releasing step. Conventionally, it has caused no trouble that the test process following completion of the wafer process has lower cleanliness in comparison with that in the wafer process clean room, but in a case that a process, such as etching or others, is performed after the test, it is necessary to perform the test process in a clean room of high cleanliness so that dust on wafers does not pollute the etching system, or an etching system which is exclusively used for the fuse disconnection is installed, which leads to higher fabrication costs rather than simple increase of fabrication steps.

As described above, in the conventional fuse disconnecting method, it is difficult to narrow a fuse pitch corresponding to increased integration of a semiconductor device while depressing increase of fabrication steps and fabrication costs.

SUMMARY OF THE INVENTION

An object of the present invention is to provide a structure of a semiconductor device including a fuse circuit which is easily higher integrated and does not add to fabrication costs and a method for fabricating the semiconductor device, and a laser system suitable to disconnect the fuses.

The present invention provides a semiconductor device and a method for fabricating the same for disconnecting a fuse by laser ablation, and a laser system suitable to disconnect fuses of the semiconductor device. Laser ablation is a phenomena that a laser beam of high intensity is irradiated to an object-to-be-irradiated to disconnect bonds of substances by energy of the irradiated laser beam and instantaneously sublimate the object-to-be-irradiated.

The conventional fuse disconnecting method using laser explosion due to absorption of a laser beam converts optical energy to vibrations of stretches, etc. of bonds of substances, i.e., to thermal energy for laser explosion, while laser ablation dissociates bonds of substances directly by optical energy, and is based on the phenomena which is quite different from laser explosion.

Due to such mechanism difference, in the laser ablation, a part a laser beam irradiated to vanishes with a boundary with respect to a part the laser beam has not been irradiated to remain in a beautiful facet. On the other hand, in the conventional laser explosion, the laser explosion takes place up to the vicinity of a part a laser beam is irradiated to, generating a number of particles and blurring the boundary between the laser beam irradiated part and a non-laser beam irradiated part. The cutting edge formed by the laser ablation is different from that formed by the laser explosion, so that the fuse disconnecting method can be distinguished by observing the cutting edge.

The laser ablation can thus beautifully remove a laser beam irradiated part but has a disadvantage that substantially all material is instantaneously removed without good controllability, with a result that not only a fuse but also a part of the semiconductor substrate therebelow are removed.

In view of this, the inventors of the present invention made earnest studies and found a material which is difficult to be sublimated by laser ablation. The inventors of the present invention are the first to have made it clear that a blocking layer of the material which is difficult to be sublimated by laser ablation is provided below the fuses to thereby stop the laser ablation on the blocking layer with good controllability.

Even in disconnecting fuses by the laser ablation, if the laser ablation can be controlled by the blocking layer, there is no risk that even with laser beams of short wavelengths, semiconductor substrates will not be damaged, as they are damaged by the conventional laser explosion. Accordingly a laser beam can have a small spot size corresponding to a wavelength of the laser beam.

In disconnecting two fuses adjacent to each other, even when both laser spots overlap each other, the blocking layer which is sufficiently thick can keep semiconductor substrates from damage. That is, a fuse pitch can be made smaller in accordance with decrease of a wavelength of the laser beam.

The laser ablation requires only a laser system to disconnect fuses and requires no additional etching system, etc., and increases neither fabrication steps and fabrication costs.

As the blocking layer for controlling the laser ablation, W (tungsten) film, for example, can be used.

That is, the above-described object is achieved by a semiconductor device comprising: a blocking layer formed on a substrate; an insulation film formed on the blocking layer; and a fuse formed on the insulation film, whereby a fuses can be disconnected by laser ablation with good controllability without damaging the base substrate. The fuses to be disconnected can be arranged at a very small pitch, which can improve integration of the fuse circuit.

The above-described object is also achieved by a semiconductor device including a memory cell region where a plurality of memory cells are formed, and a fuse circuit region where a fuse circuit for replacing a defective memory cell by a redundant memory cell is formed, the semiconductor device comprising: a blocking layer formed in the fuse circuit region; an insulation film formed on the blocking layer; and a fuse formed on the insulation film and formed of the same conducting layer as a conducting layer forming the memory cells or an interconnection layer formed in the memory cell region. The semiconductor device having this structure allows the fuses which can be disconnected by the laser ablation with good controllability to a replacement circuit to a redundant circuit of a memory device. The fuses to be disconnected by the laser ablation can be arranged at a very small pitch, which can improve integration of the memory device.

In the above-described semiconductor device, it is preferable that the fuse is formed of the same conducting layer as a metal interconnection layer formed in the memory cell region. The fuses can be formed of the same conducting layer as any of the metal interconnection layers forming the semiconductor device.

In the above-described semiconductor device, it is preferable that each of the memory cells includes a transfer transistor and a capacitor; and the fuse is formed of the same conducting layer as a gate electrode of the transfer transistor, a storage electrode of the capacitor, an opposed electrode of the capacitor or a bit line. The fuses may be formed of not only the metal interconnection layer but also of the same conducting layer as the above-described conducting layer forming the memory cells.

In the above-described semiconductor device, it is preferable that the device further comprises a cover film formed on the fuse. In the above-described semiconductor device the fuses can be disconnected by laser ablation, so that even in a case that the cover film is formed on the fuses, the fuses can be disconnected from above the cover film.

In the above-described semiconductor device, it is preferable that the device further comprises a polyimide film formed on the cover film for relaxing a stress in assembly process. In the above-described semiconductor device the fuses can be disconnected by laser ablation, so that even in a case that the polyimide film is formed on the cover film, the fuses can be disconnected from above the polyimide film.

In the above-described semiconductor device, it is preferable that the blocking layer is formed of a film including a tungsten film. Because tungsten film is difficult to be sublimated by the laser ablation, the blocking layer if formed of a film including a tungsten film, whereby laser ablation can be stopped by the blocking layer.

In the above-described semiconductor device, it is preferable that the fuse is formed of a film including a polycrystalline silicon film, an aluminum film or an aluminum alloy. These conducting materials are very easily sublimated by laser ablation, and can be used as fuses to be disconnected by laser ablation.

In the above-described semiconductor device, it is preferable that the device includes the fuse disconnected by laser ablation.

The above-described object is also achieved by a semiconductor device including a memory cell region where a plurality of memory cells are formed, and a fuse circuit region where a fuse circuit for replacing a defective memory cell by a redundant memory cell is formed, the semiconductor device comprising: a base semiconductor substrate; a layer or layers formed on the base semiconductor substrate; and a fuse formed on the layer or the layers in the fuse circuit region and formed of the same conducting layer as a conducting layer forming the memory cells or an interconnection layer formed in the memory cell region and disconnected by laser ablation, wherein a thickness of the layer or the layers is much thicker than a thickness of the fuse.

The above-described object is also achieved by a method for fabricating a semiconductor device comprising the steps of: forming a blocking layer on a substrate; forming an insulation film on the blocking layer; and forming a fuse on the insulation film. The above-described method for fabricating the semiconductor device can fabricate a semiconductor device which can disconnect the fuses by laser ablation. The fuses to be disconnected can be arranged at a very small pitch, which can improve integration of the fuse circuit.

In the above-described method for fabricating the semiconductor device, it is preferable that the method further comprises after the fuse forming step, a step of disconnecting the fuse by laser ablation. Fuses are disconnected by the laser ablation, whereby the fabrication process is not complicated, and no additional fabrication system is required. As a result, without increasing fabrication costs, the fuses can be arranged at a smaller pitch.

In the above-described method for fabricating the semiconductor device, it is preferable that in the step of disconnecting the fuse, the laser ablation is stopped by the blocking layer. The blocking layer is formed of a material which is difficult to be sublimated by laser ablation below the fuses, whereby the laser ablation can be stopped by the blocking layer with good controllability.

In the above-described method for fabricating the semiconductor device, it is preferable that in the step of disconnecting the fuse, the fuse is disconnected by a laser beam having a wavelength of not more than 500 nm. It is not necessary that the laser ablation considers absorption of a laser beam by the base substrate, so that laser beams of a below 1 $\mu$m-wavelength range, which is the absorption range of the substrate, can be used. By using such laser beams of short wavelengths the laser beams can have reduced spot sizes, whereby the fuses can be arranged at a small fuse pitch.

In the above-described method for fabricating the semiconductor device, it is preferable that the laser beam is third or more harmonics of a Nd:YAG laser or third or more harmonics of a Nd:YLF laser.

In the above-described method for fabricating the semiconductor device, it is preferable that the method further comprises after the fuse forming step, a step of forming a cover film for covering the fuse. In the laser ablation the layers are sublimated sequentially from above, so that even in a case that the cover film is formed on the fuses, the fuses can be disconnected from above the cover film.

In the above-described method for fabricating the semiconductor device, it is preferable that the method further comprises a step of forming a polyimide film for relaxing a stress in assembly process. Even in a case that the polyimide film is formed on the cover film, the fuses can be disconnected also from above the polyimide film.

In the above-described method for fabricating the semiconductor device, it is preferable that in the step of forming the blocking layer, the blocking layer including a tungsten film is formed.

The above-described object is also achieved by a laser system for disconnecting by laser ablation a fuse of the semiconductor device including a blocking layer formed on a substrate, an insulation film formed on the blocking layer and the fuse formed on the insulation film, the laser system comprising: a laser resonator for oscillating a laser beam having an oscillation wavelength of not more than 500 nm and an energy density sufficient to disconnect the fuse by laser ablation; a lens mechanism for condensing the laser beam emitted by the laser resonator into a required spot size; and an alignment mechanism for irradiating the laser beam outputted by the laser resonator to a required position on the semiconductor device. The laser system having this structure applies a laser beam at an arbitrary position on a wafer to disconnect the fuses by laser ablation.

In the above-described laser system it is preferable that the laser resonator outputs third or more harmonics of a Nd:YAG laser or third or more harmonics of a Nd:YLF laser.

DETAILED DESCRIPTION OF THE INVENTION

[A First Embodiment]

The semiconductor device and the method for fabricating the same according to a first embodiment of the present invention will be explained with reference to FIGS. 1A–1B, 2, 3A–3C and 4A–4B.

Figure 1A:
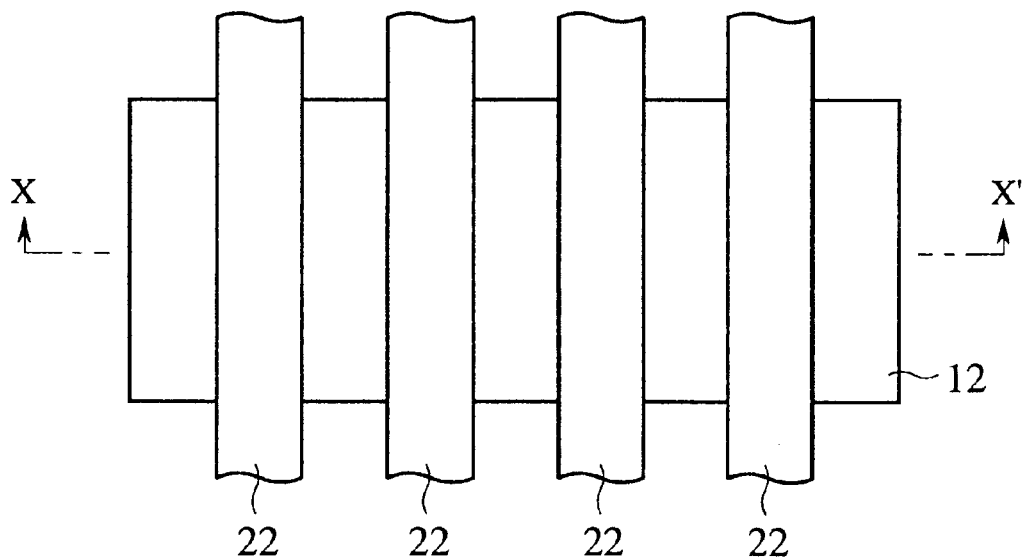
FIG. 1A is a plan view of a semiconductor device according to a first embodiment of the present invention, which shows a structure thereof.
Figure 1B:
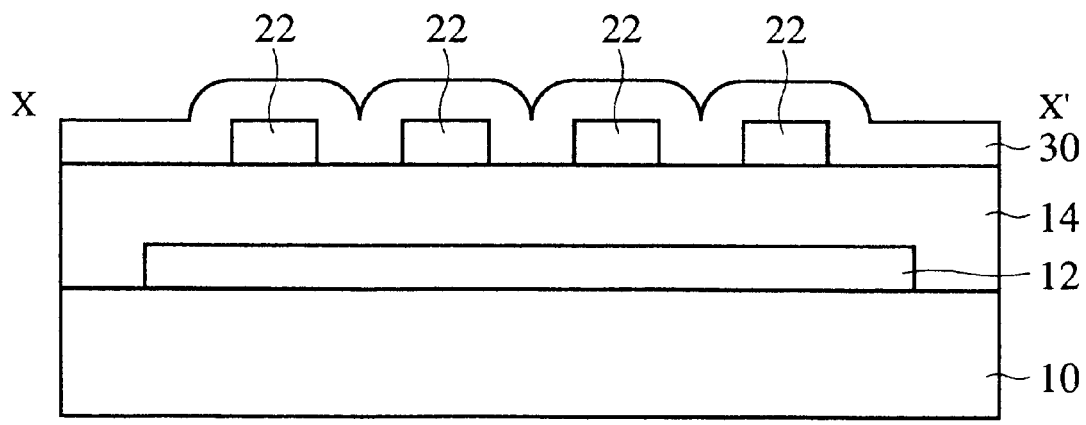
FIG. 1B is a sectional view of the semiconductor device according to the first embodiment of the present invention, which shows a structure thereof.
Figure 2:
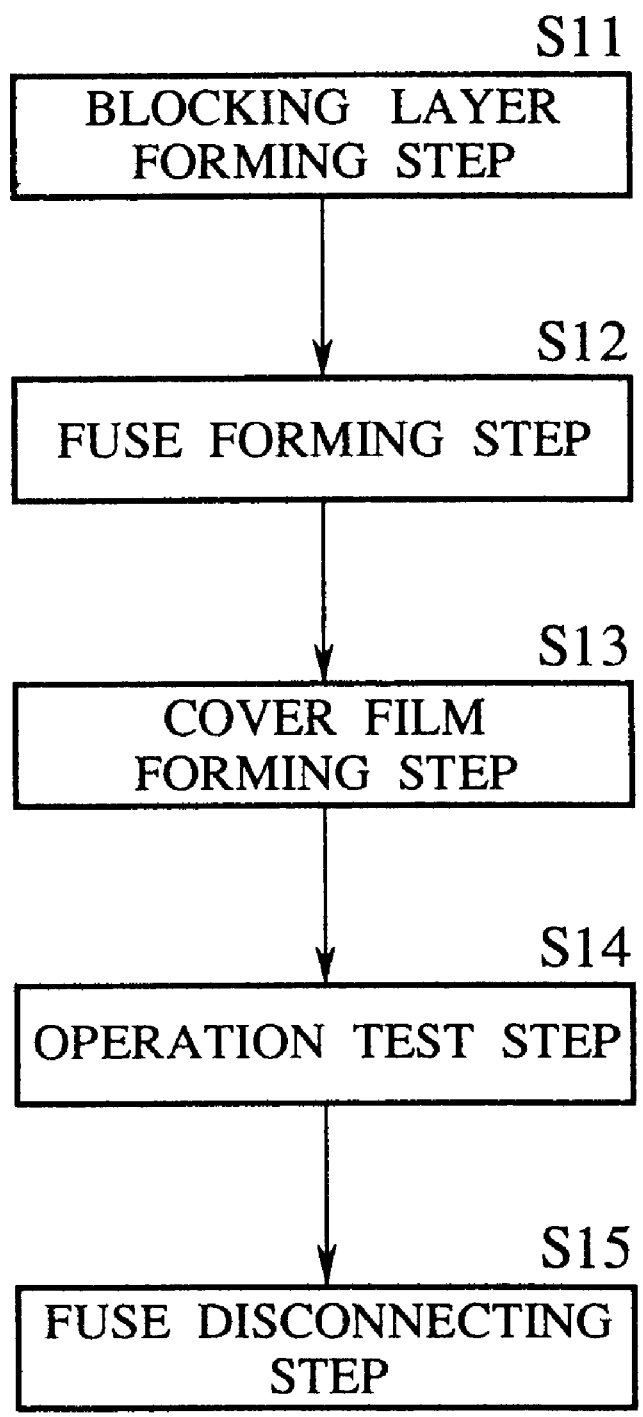
FIG. 2 is a flow chart of the method for fabricating the semiconductor device according to the first embodiment of the present invention.

FIG. 1A is a plan view of the semiconductor device according to the present embodiment, which shows a structure thereof. FIG. 1B is a sectional view of the semiconductor device according to the present embodiment, which shows a structure thereof. FIG. 2 is a flow chart of the method for fabricating the semiconductor device according to the present embodiment. FIGS. 3A–3C and 4A–4B are sectional views of the semiconductor device in the steps of the method for fabricating the semiconductor device, which show the method.

First, the structure of the semiconductor device according to the present embodiment will be explained with reference to FIGS. 1A and 1B. FIG. 1A is a plan view of the semiconductor device according to the present embodiment, which shows the structure thereof. FIG. 1B is a sectional view along the line 1–1' in FIG. 1A.

A blocking layer 12 for restraining laser ablation is formed on a substrate 10. An inter-layer insulation film 14 is formed on the substrate 10 and the blocking layer 12. A plurality of fuses 22 of, e.g., a conducting film, such as aluminum or polycrystal line silicon, are formed on the inter-layer insulation film 14. A cover film 30 is formed on the fuses 22.

As described above, the semiconductor device according to the present embodiment is characterized in that the blocking layer 12 for restraining laser ablation is formed below a region where the fuses 22 are formed. Owing to the blocking layer 12 thus provided, in disconnecting the fuses 22 by laser ablation, which lacks controllability, the laser ablation can be stopped by the blocking layer 12 with good controllability.

It is preferable that the blocking layer 12 is formed of a material which is difficult to be sublimated by laser ablation, and the blocking layer 12 can be provided specifically by a W (tungsten) film, or a laminated film of W/TiN/Ti or others. These film and laminated films have been conventionally widely used in the fabrication of semiconductor devices and have good processing alignment.

The blocking layer may be provided by all layers of the semiconductor device arranged below the fuses 22 because unessentially the blocking layer specially has the blocking function and preferably the layer disposed between the fuses 22 and the base semiconductor substrate is thicker. It is preferable that the thickness of the layer disposed between the fuse 22 and the base semiconductor substrate is much thicker than the thickness of the fuse 22.

The fuses 22 may be formed of any material as long as the material is sufficiently susceptible to the laser ablation in comparison with the blocking layer 12. Materials actually used in semiconductor devices are, e.g., polycrystalline silicon, metal suicide, Al, Al alloys, such as Al—Si—Cu, Al—Cu—Ti, etc., and Ti, TiN and their laminated films.

A pitch of the fuses 22 is determined by a spot size of a laser beam and an alignment allowance. A minimum spot size of a laser beam can be approximated to be about twice a wavelength of the laser beam. For example, when a wavelength of a laser beam is 0.355 μm, and an alignment allowance is 0.5 μm, a pitch of the fuses 22 is about 1.2 μm. Accordingly, in comparison with conventional semiconductor devices, the fuses 22 can have a very small pitch.

The blocking layer has a film thickness which can endure twice laser ablation, whereby there is no risk that even when spots of laser beams for disconnecting adjacent fuses overlap each other, the base substrate will not be damaged, and it is not necessary to ensure an alignment allowance. The fuses 22 can have accordingly further smaller pitches.

It is unnecessary that the laser ablation considers the absorption by the base substrate, which allows a laser beam to have a shorter wavelength and accordingly allows a fuse pitch to be further smaller. Accordingly the semiconductor device can be further micronized.

As described above, according to the present embodiment, the blocking layer of a material which is difficult to be sublimated by the laser ablation is provided below the fuses, whereby the semiconductor device can have a structure which allows the fuses to be disconnected by the laser ablation with good controllability.

The laser ablation does not affect the base substrate even when a laser beam has a short wavelength, which permits a spot size of a laser beam to be very small corresponding to a wavelength of the laser beam. This allows a fuse pitch to be smaller, which enables the semiconductor device to be more highly integrated.

Next, the method for fabricating the semiconductor device according to the present embodiment will be explained with reference to FIGS. 2, 3A–3C and 4A–4B.

The method for fabricating the semiconductor device according to the present embodiment is characterized, as shown in FIG. 2, by comprising the step of forming the blocking layer for restraining laser ablation on a substrate (Step S11), the step of forming fuses on the blocking layer through an insulation film (Step S12), the step of forming a cover film for covering the fuses (Step S13), the test step of making an operation test on a circuit (Step S14), and the step of disconnecting a fuse by the laser ablation (Step S15).

The method for fabricating the semiconductor device according to the present embodiment will be detailed by means of a specific structure thereof.

First, the blocking layer 12 for restraining laser ablation is formed on the substrate 10 with a prescribed device formed on (Step S11). The blocking layer 12 is formed, e.g., by depositing an about 350 nm-thick W film on the substrate 10 by CVD method and patterning the W film in a prescribed pattern.

Figure 3A:
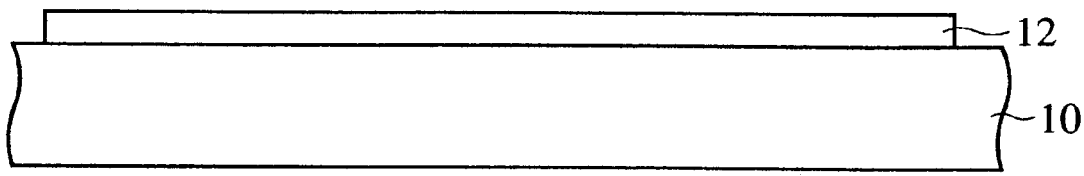
FIGS. 3A–3C and 4A–4B are sectional views of the semiconductor device according to the first embodiment of the present invention in the steps of the method for fabricating the same, which explain the method.
Figure 3B:
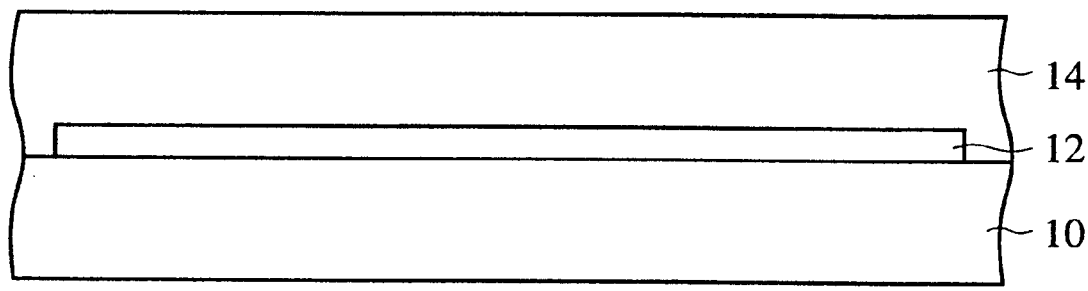

Then, the inter-layer insulation film 14 for covering the blocking layer 12 is formed. The inter-layer insulation film 14 is formed by, e.g., depositing an about 1 μm-thick silicon oxide film by CVD (FIG. 3B).

Subsequently, a conducting film to be the fuses is deposited on the inter-layer insulation film 14. For example, an about 100 nm-thick TiN film 16, an about 1 μm-thick Al—Cu—Ti film 18 and an about 50 nm-thick TiN film 20 are deposited.

Figure 3C:
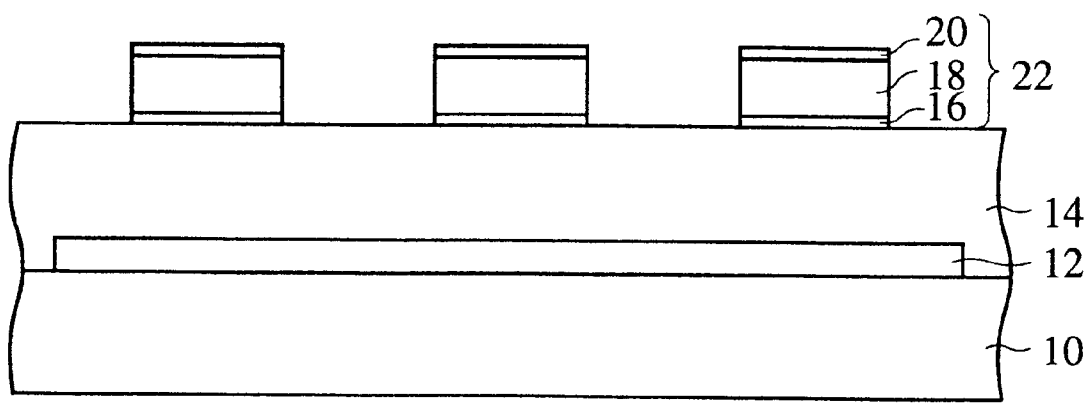

The laminated film of the TiN film 20/Al—Cu—Ti film 18/the TiN film 16 is patterned to form the fuses 22 of the laminated film over the blocking layer 12 (Step S12, FIG. 3C). The fuses 22 are formed over the blocking layer 12, for example, in an about 0.7 μm-width and at a 2 μm-pitch.

Figure 4A:
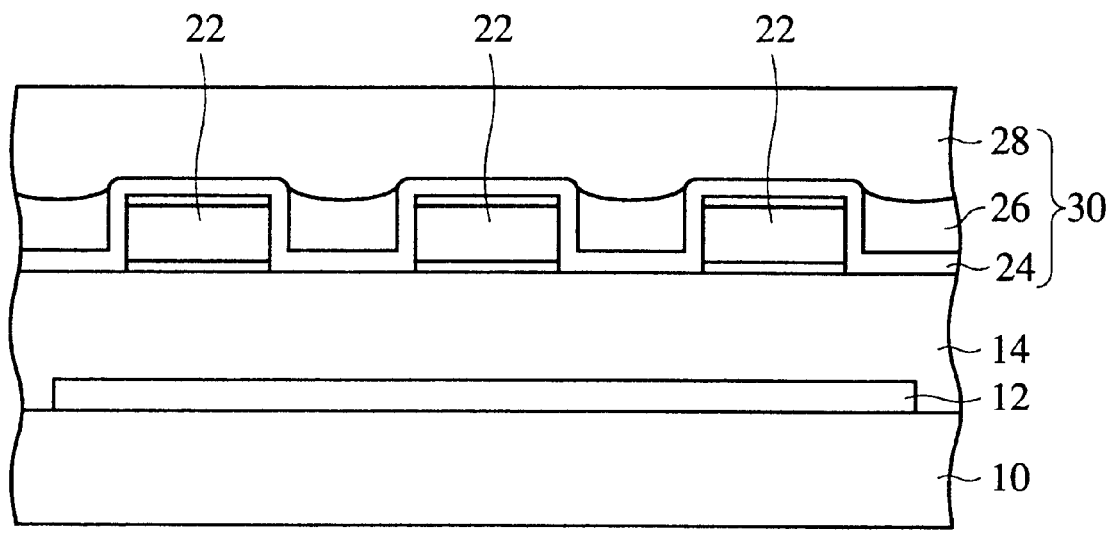

Then, the cover film 30 is formed on the substrate with the fuses 22 formed on (Step S13). The cover film 30 comprising, e.g., an SiON film 24, an SOG film 26 and an SiN film 28 is formed, e.g., by depositing the SiON film 24 in an about 100 nm-thick, next applying the SOG film 26 in an about 1 μm-thick and planarizing the surface thereof, then depositing the SiN film 28 by CVD in an about 1 μm-thick (FIG. 4A).

Subsequently, openings for exposing bonding pads (not shown) are formed in the cover film by the usual lithography and etching.

In conventional methods for fabricating semiconductor devices in which fuses are disconnected by laser explosion, it is necessary to cause the laser explosion so that the cover film is removed or is thinned, and usually etching for forming fuse windows concurrently with forming openings for bonding pads is performed. However, in the method for fabricating the semiconductor device according to the present embodiment using laser ablation, it is not necessary to form fuse windows in the cover film 30 because the films are sublimated sequentially from above. Accordingly, in the step of patterning the cover film 30 it is sufficient to form only the bonding pad openings of a 100 μm-order, and it is unnecessary to form micronized fuse windows. This can simplify the lithography step. This does not mean that the fuse windows should not be formed as in the conventional methods. Formation of the fuse windows has a merit that the films on the fuses can be decreased, which allows a total power of the laser ablation to be decreased, and furthermore, merits of increased throughputs and laser ablation control with higher accuracy.

Then, a prescribed circuit test is performed to locate a defective memory cell to locate a fuse to be disconnected for replacement of the defective memory cell by a redundant memory (Step S14). At this time, coordinates of a location of the fuse to be disconnected on the wafer are stored in advance for use in disconnecting the fuse.

Figure 4B:
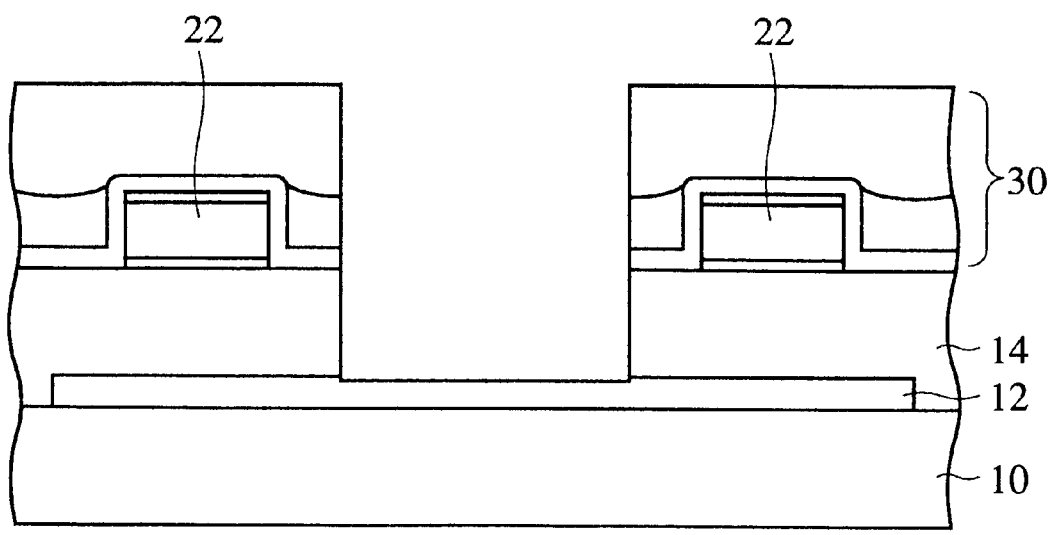

Then, the fuse 22 located by the circuit test is disconnected by the laser ablation (Step S15, FIG. 4B). In the above-described structure of the semiconductor device, the fuse 22 could be disconnected, the laser ablation being stopped by the blocking layer 12 under conditions of a 355 nm-oscillation wavelength, a 40 nsec pulse width, a 100 μj power and a 2.3 μm spot size. As for the spot size of the laser beam, an about 0.71 μm spot size can be also used. The spot size can be reduced until about twice a wavelength of the laser beam.

Then, the circuit test is repeated as required, and proper products are assembled.

As described above, according to the present embodiment, a fuse 22 is disconnected by the laser ablation, which makes it unnecessary to form fuse windows in the cover film 30. This simplifies the lithography step for patterning the cover film 30. To disconnect a fuse 22 neither a photoresist nor an etching system is necessary, which needs no additional etching system exclusively used in the fuse disconnection.

In the laser ablation a laser system can independently shorten a wavelength, and can have a very small spot size. Accordingly, a region for the fuse circuit can have a drastically reduced area, whereby the semiconductor device can have higher integration.

In some cases, a polyimide film is formed on the cover film 30 as cushioning material for restraining influence due to thermal expansion difference between the semiconductor chip and a plastic package when the former is loaded in the latter. The method for fabricating the semiconductor device according to the present embodiment is effective in these cases. That is, in the method for fabricating the semiconductor device according to the present embodiment using the laser ablation, a target is sublimated sequentially from the surface thereof, and even in the case that a polyimide film is formed on the cover film, a fuse can be disconnected through the polyimide film.

Figure 5:
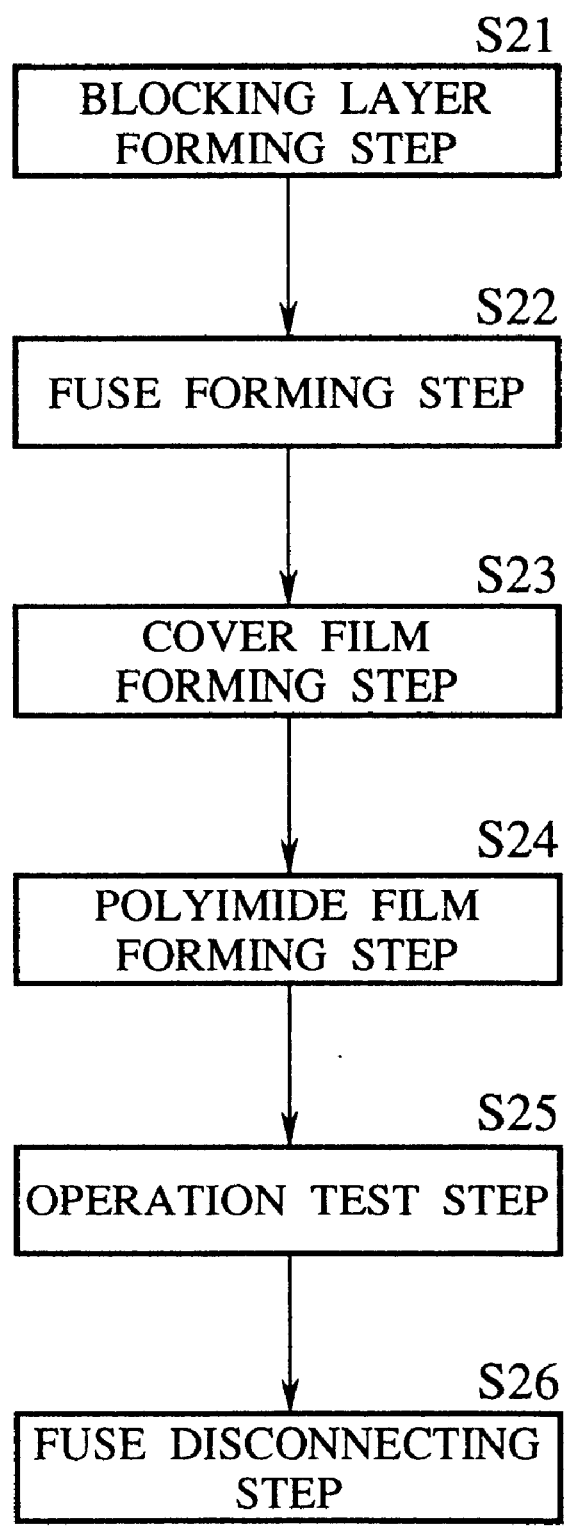
FIG. 5 is a flow chart of the method for fabricating the semiconductor device according to a modification of the first embodiment (Part. 1).

As exemplified in FIG. 5, the blocking layer is formed on the substrate (Step S21), the fuses are formed over the blocking layer through the inter-layer insulation film (Step S22), the cover film for covering the fuses is formed (Step S23), the polyimide film for covering the cover film is formed (Step S24), a prescribed operation test is conducted (Step S25), and a fuse is disconnected by the laser ablation (Step S25).

Figure 6:
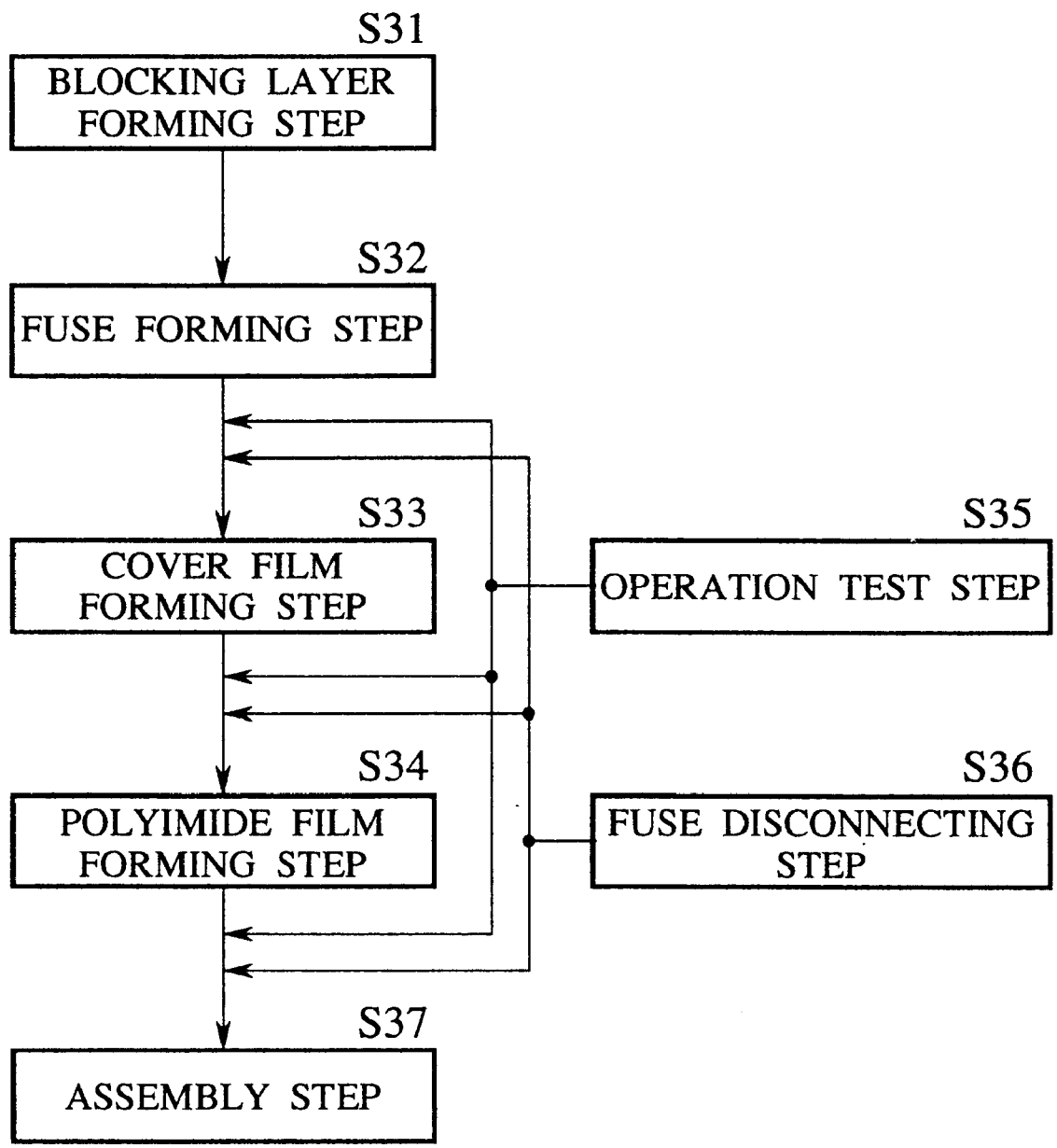
FIG. 6 is a flow chart of the method for fabricating the semiconductor device according to a modification of the first embodiment (Part. 2).

In the present embodiment, the operation test is conducted after the cover film is formed, but the operation test can be conducted if at least the final interconnection layer is formed. Fuses can be disconnected after the operation test. Accordingly, in the method for fabricating the semiconductor device as exemplified in FIG. 6, which comprises the step of forming the blocking layer on a substrate (Step S31), the step of forming fuses over the blocking layer through the insulation film (Step S32), the step for forming the cover film for covering the fuses (Step S33), and the step of forming the polyimide film for covering the cover film (Step S34), the operation test step (Step S35) may be performed before the cover film forming step or after the polyimide film forming step. The fuse disconnecting step (Step S36) may be performed before the cover film forming step or the polyimide film forming step if the fuse disconnecting step is after the operation test step (Step S35).

[A Second Embodiment]

A semiconductor device according to a second embodiment of the present invention will be explained with reference to FIG. 7.

Figure 7:
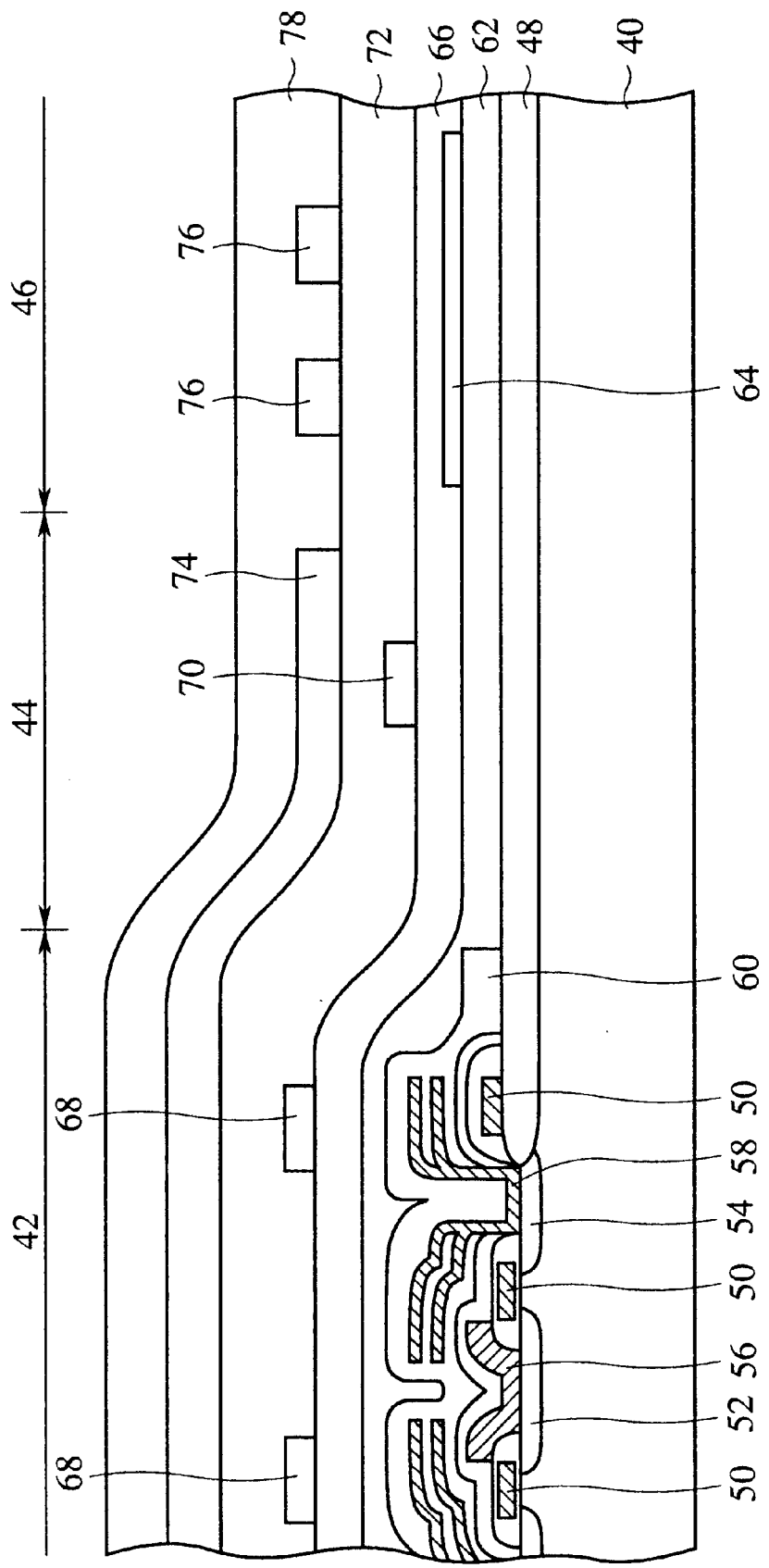
FIG. 7 is a diagrammatic sectional view of the semiconductor device according to a second embodiment of the present invention, which shows a structure thereof.

FIG. 7 is a diagrammatic view of the structure of the semiconductor device according to the present embodiment.

In the present embodiment one example of application of the semiconductor device according to the first embodiment and the method for fabricating the same to a DRAM will be explained. In a DRAM, a fuse circuit is used to replace an address circuit for designating memory cells, so that a required fuse of the fuse circuit is disconnected to replace an address of the defective memory cell by a redundant memory cell. By thus constituting the DRAM, even when a memory cell is defective, the memory cell is replaced by a redundant memory cell, whereby the DRAM is saved from becoming generally defective.

On a silicon substrate 40 there are formed a memory cell region 42 where a plurality of memory cells are formed, a peripheral circuit region 44 where a peripheral circuit for driving the memory cells is formed, and a fuse circuit region 46 where a plurality of fuse circuits for replacing a defective memory cell by a redundant memory cell is formed.

A device isolation film 48 is formed on the silicon substrate 40. On the silicon substrate 40 in the memory cell region 42 a transfer transistor including a gate electrode 50, and a source/drain diffused layer 52, 54 is formed. A bit line 56 is connected to the source/drain diffused layer 52. A fin-shaped storage electrode 58 is connected to the source/drain diffused layer 54. The storage electrode 58 is covered with an opposed electrode 60 through a dielectric film, and the storage electrode 58, the dielectric film and the opposed electrode 60 constitute a capacitor. In the memory cell region 42 there are thus formed a plurality of the memory cells each including the transfer transistor and the capacitor. The structure of the memory cell shown in FIG. 7 is detailed in, e.g., Japanese Patent Publication No. 08-28476 of the applicant of the present application. In the peripheral circuit region there are formed a plurality of peripheral transistors (not shown) forming a peripheral circuit. On the silicon substrate 40 with the memory cells and the peripheral transistors formed on there is formed an insulation film 62. A blocking layer 64 of a W film for restraining the laser ablation is formed on the inter-layer insulation film 62 in the fuse circuit region 46. An inter-layer insulation film 66 is formed on the inter-layer insulation film 62 with the blocking layer 64 formed on. On the inter-layer insulation film 66 there are formed strapping word lines 68 of the same Al alloy layer, and an interconnection layer 70 interconnecting the peripheral transistors to constitute the peripheral circuit. An inter-layer insulation film 72 is formed on the inter-layer insulation film 66 with the strapping word lines 68 and the interconnection layer 70 formed on. A interconnection layer 74 and fuses 76 are formed of the same Al alloy on the inter-layer insulation film 72. A cover film 78 is formed on the inter-layer insulation film 72 with the interconnection layer 74 and the fuses 76 formed on.

As described above, the semiconductor device according to the present embodiment is characterized in that the semiconductor device according to the first embodiment is applied to the fuse circuit of a DRAM for the replacement to the redundant circuit. That is, the fuses of the fuse circuit is formed of a second metal interconnection layer forming the DRAM, and the blocking layer 64 for restraining the laser ablation is formed below the fuses 76. This structure of the semiconductor device enables a fuse to be disconnected by the laser ablation with good controllability.

The fuse disconnection can be performed in the same way as in the method for fabricating the semiconductor device according to the first embodiment.

As described above, according to the present embodiment, as the fuse circuit for the replacement by the redundant circuit in a DRAM, the fuse circuit including the blocking layer 64 of a material which is difficult to be sublimated by the laser ablation is applied, whereby the semiconductor device can have a structure which permits a fuse to be disconnected by the laser ablation with good controllability.

In the laser ablation, laser beams of a short wavelength do not affect the base substrate, which permits laser beams to have a very small spot size corresponding to their wavelength. This enables a fuse pitch to be smaller, which can improve integration of the DRAM.

Figure 8:
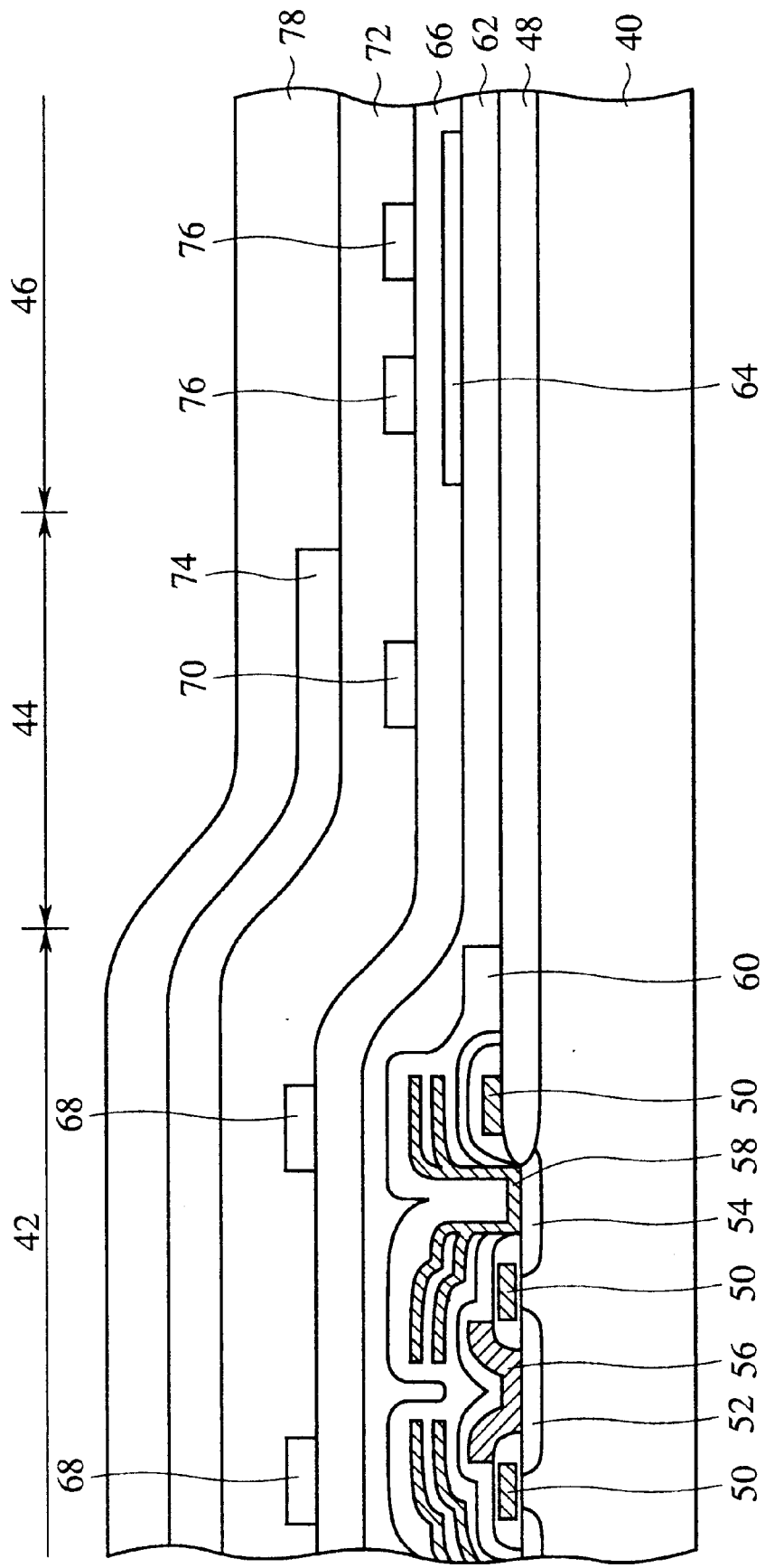
FIG. 8 is a diagrammatic sectional view of the semiconductor device according to a modification of the second embodiment of the present invention, which shows a structure thereof (Part 1).

In the present embodiment, the interconnection layer forming the fuses 76 is the second metal interconnection layer but is not essentially the second metal interconnection layer. That is, in the laser ablation, the target is sublimated sequentially from the top layer, so that the fuses can be formed of any of the interconnection layers. It is not essential that the interconnection layer forming the fuses 76 is the uppermost interconnection layer, but as exemplified in FIG. 8, the fuses 76 may be formed of a first metal interconnection layer. Even in a case that three or more metal interconnection layers are included, the fuses 76 may be formed of any of the metal interconnection layers. However, decreasing the films on the fuses allows a total power of the laser ablation to be decreased, and furthermore, merits of increased throughputs and laser ablation control with higher accuracy. Thus, it is preferable that the fuses is formed of an uppermost conducting layer.

Figure 9:
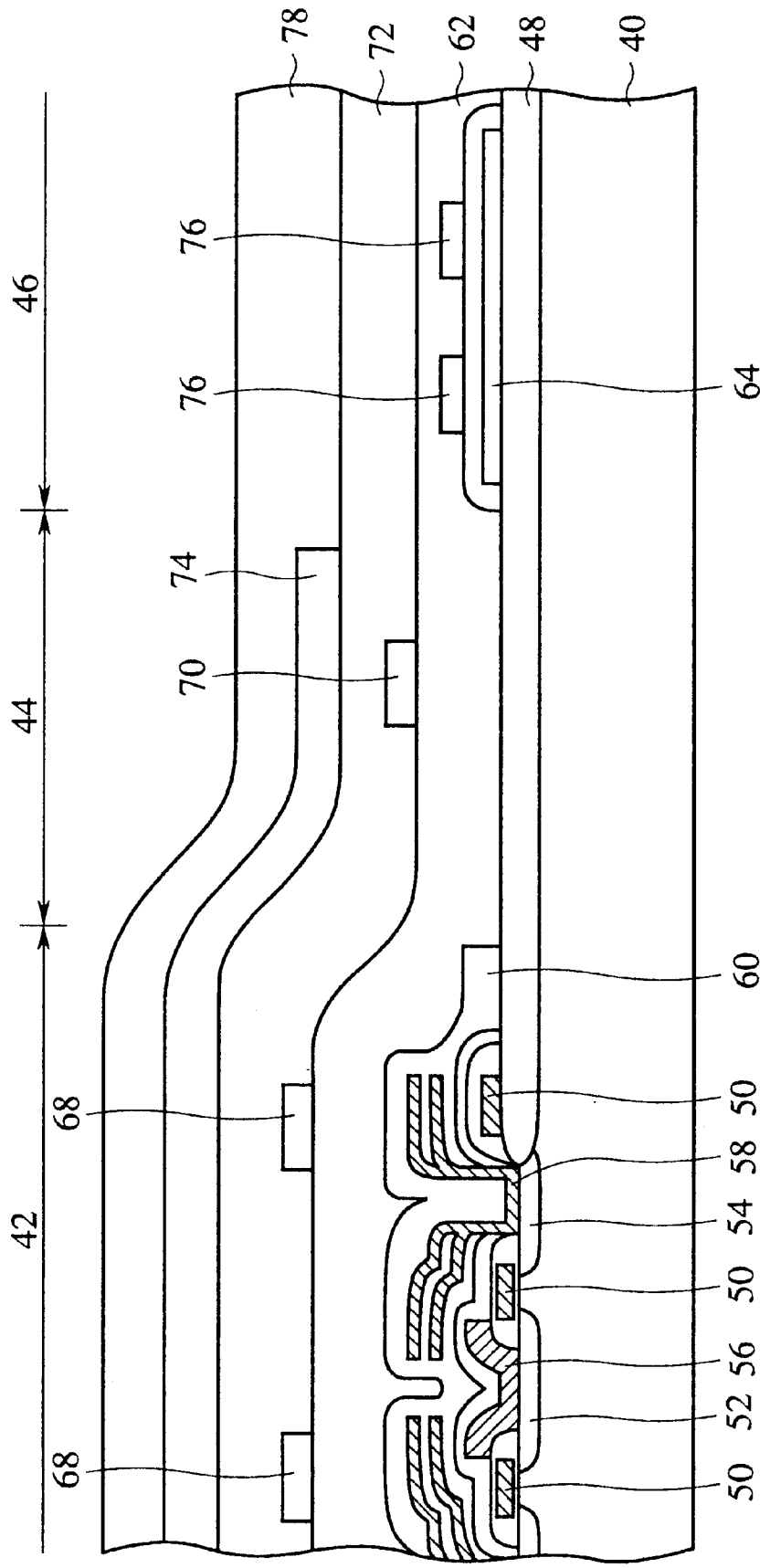
FIG. 9 is a diagrammatic sectional view of the semiconductor device according to a modification of the second embodiment of the present invention, which shows a structure thereof (Part 2).

If the blocking layer 64 of a material which is difficult to be sublimated by the laser ablation is disposed below the fuses 76, the fuses 76 may be formed of not only the metal interconnection layers but also other conducting layers. As exemplified in FIG. 9, the fuses 76 can be formed of the conducting layer forming the opposed electrode 60, and the blocking layer 64 can be formed therebelow. The blocking layer 64 may be an additional film or may be formed of conducting layer positioned below the fuses 76, e.g., the same conducting layer as the storage electrode 58, the bit line 56 and the word lines 50.

It is also possible that the fuses are formed of the same conducting layer as the storage electrode or the bit line.

In the present embodiment, the fuse circuit of the first embodiment is applied to a DRAM including fin-shaped capacitors but may be applied to DRAMs of other various structures. The fuse circuit is also applicable to other memory devices, such as SRAMs, etc.

[A Third Embodiment]

The laser system according to a third embodiment of the present invention will be explained with reference to FIG. 10.

Figure 10:
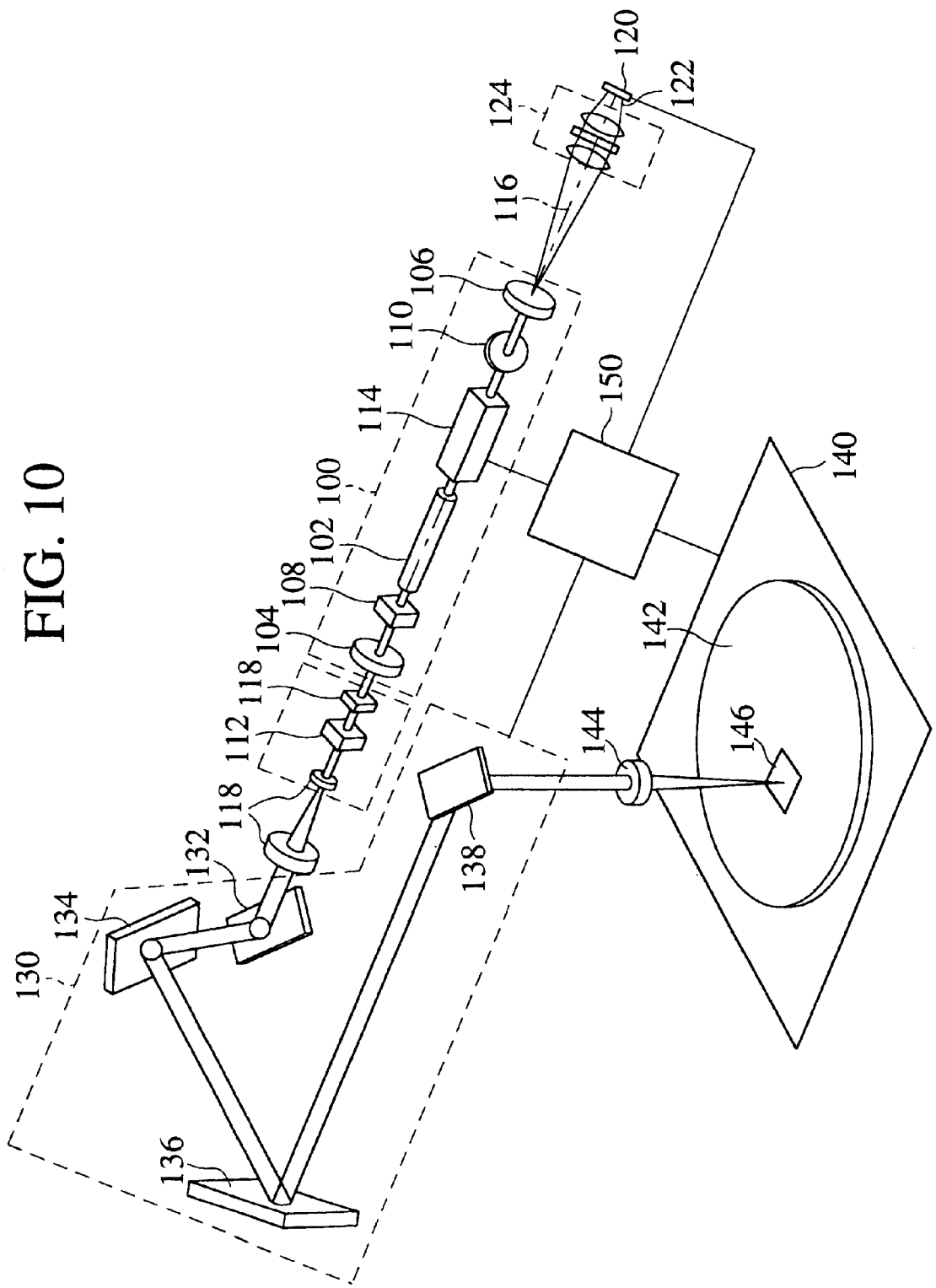
FIG. 10 is a diagrammatic view of the laser system according to a third embodiment of the present invention.
Figure 11A:
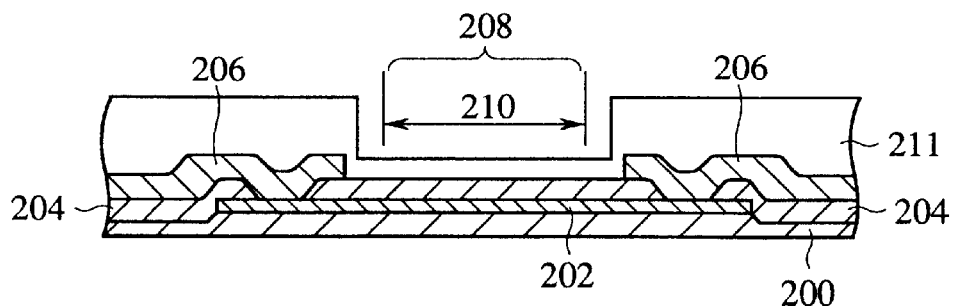
FIGS. 11A–11C are diagrammatic views of the conventional semiconductor device, which show a structure thereof and the method fabricating the same (Part 1).
Figure 11B:
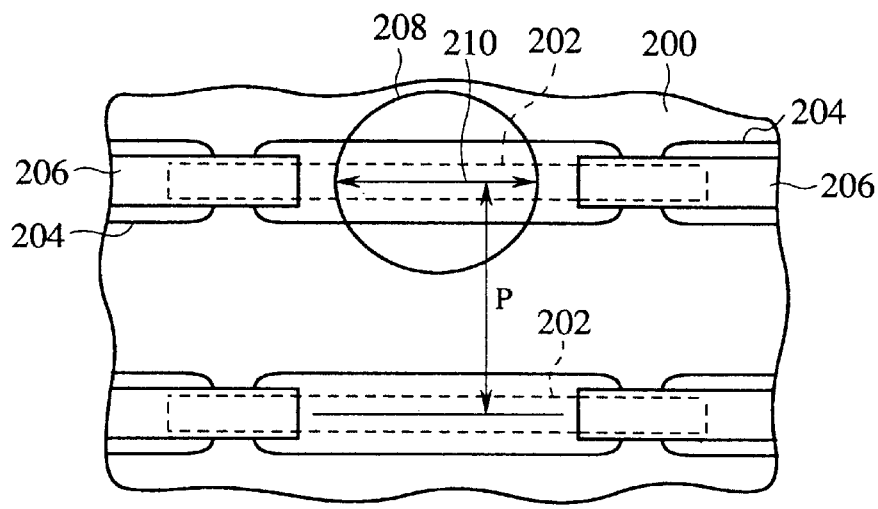
Figure 11C:
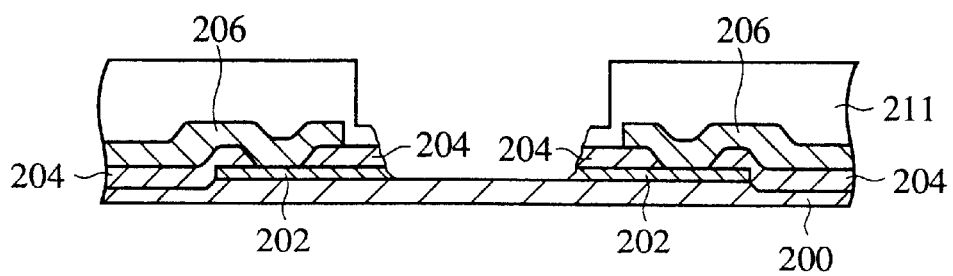
Figure 12A:
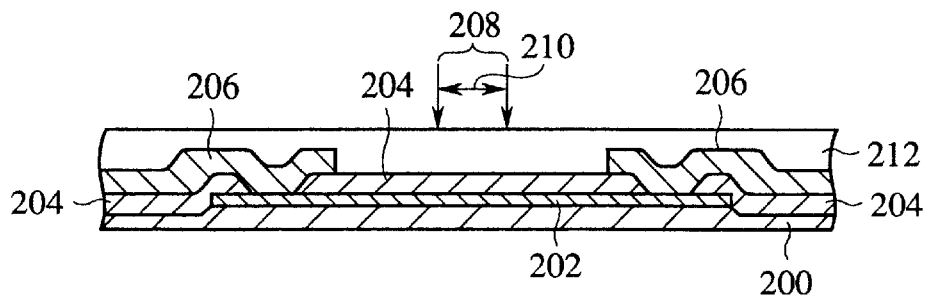
FIGS. 12A–12D are diagrammatic views of the conventional semiconductor device, which show the structure thereof and the method fabricating the same (Part 2).
Figure 12B:
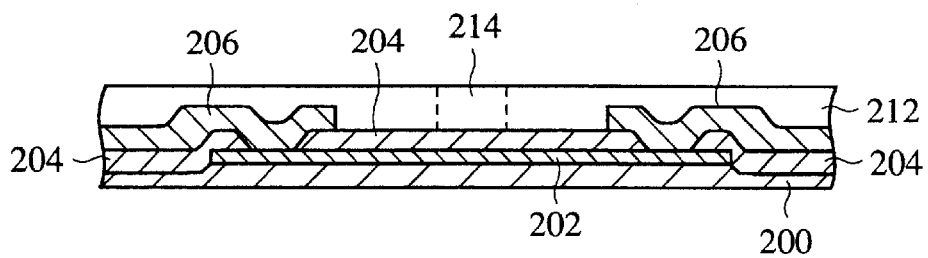
Figure 12C:
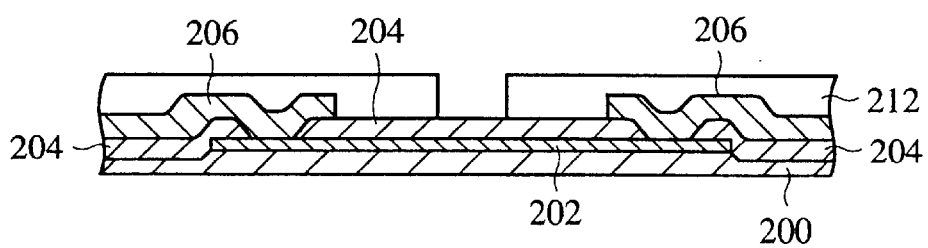
Figure 12D:
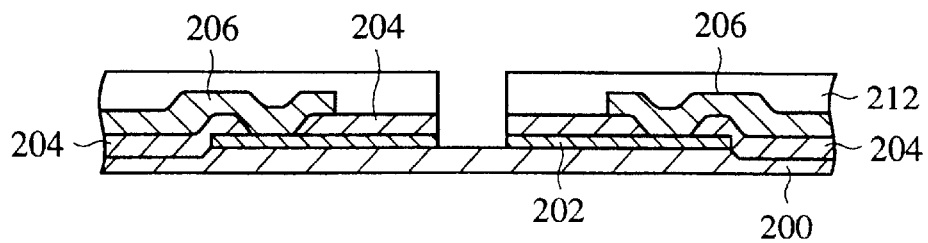

FIG. 10 is diagrammatic view of the laser system according to the present embodiment, which shows a structure thereof.

In the present embodiment a laser system which is applicable to the method for fabricating the semiconductor device according to the second embodiment will be explained.

The laser system according to the present embodiment mainly comprises a laser resonator 100 for oscillating laser beams, a laser diode 120 for optical pumping a laser light source of the laser resonator, a lens mechanism 118 for condensing a laser beam outputted by the laser resonator 110 to a required spot size, and a beam alignment mechanism 130 for irradiating the laser beam outputted by the laser resonator 100 to a required position on a wafer 142 mounted on a stage 140.

A laser beam 122 emitted by the laser diode 120 is incident on the laser resonator 100 through the lens mechanism 124 to optically pump the laser light source of the laser resonator 100.

The laser resonator 100 includes a laser light source 102, two sheets of mirrors 104, 106 arranged with the laser light source 102 disposed therebetween for sustaining stimulated emission, control mechanisms 108, 110, 112 for converting or adjusting a frequency of a laser beam, a Q switch 114 for rapidly changing Q of the laser resonator, which are arranged along an optical axis 116 of the laser beams. The laser light source 102 can be, e.g., a 442 nm-oscillation wavelength He—Cd gas laser, a Nd:YAG solid laser of a 355 nm-third harmonics oscillation wavelength, and a Nd:YLF solid laser of a 349 nm-third harmonics oscillation wavelength. The mirror 106 preferably reflects a laser beam substantially at a 100% reflectance. The mirror 104 transmits a part of a laser beam, and the laser beam transmitted by the mirror 104 is used as an output laser beam. The control mechanisms 108, 110, 112 are not necessary in a case that a laser beam can be used as it is, but because of the control mechanisms 108, 110, 112, a wavelength of a laser beam can be converted to a required oscillation wavelength by, e.g., optical parametric oscillation or nonlinear frequency conversion, such as doubling, tripling or quadrupling. The laser beam transmitted by the mirror 104 is incident on the beam alignment mechanism 130 through the lens mechanism 118.

The beam alignment mechanism 130 includes a plurality of reflecting plates 132, 134, 136, 138. The reflecting plates 132, 134, 136, 138 are suitably controlled to irradiate a laser beam outputted by the laser resonator 100 to a required position on the wafer 140. A laser beam irradiated to the beam alignment mechanism 130 and the wafer 140 is formed into a required spot size.

The laser resonator 100, the laser diode 120, the beam alignment mechanism 130 and the stage 140 are concurrently controlled by laser control means 150 to irradiate a laser beam outputted under required laser oscillation conditions to a required position on the wafer 142. Coordinate information of a position on the wafer 142 is given to the laser control means when a laser beam is irradiated in data of coordinates of a fuse-to-be-disconnected located by the operation test conducted beforehand on a chip 146.

The laser system having such structure can irradiate a laser beam to an arbitrary position on a wafer to disconnect a fuse by the laser ablation.

What is claimed is:

1. A method for fabricating a semiconductor device comprising the steps of:

forming a first insulation film over a substrate;

forming a blocking layer on the first insulation film, the blocking layer being for preventing the first insulation film and/or the substrate from ablating when a laser beam is irradiated;

forming a second insulation film on the blocking layer;

forming a fuse on the second insulation film;

forming a cover film for covering the fuse; and disconnecting the fuse by laser ablation, the cover film being removed with disconnecting the fuse by laser ablation.

2. A method for fabricating a semiconductor device according to claim 1, further comprising after the step of forming the fuse, a step of disconnecting the fuse by laser ablation.

3. A method for fabricating a semiconductor device according to claim 2, wherein in the step of forming the blocking layer, the blocking layer including a tungsten film is formed.

4. A method for fabricating a semiconductor device according to claim 1, wherein in the step of disconnecting the fuse, the laser ablation is stopped by the blocking layer.

5. A method for fabricating a semiconductor device according to claim 1, wherein in the step of disconnecting the fuse, the fuse is disconnected by a laser beam having a wavelength of not more than 500 nm.

6. A method for fabricating a semiconductor device according to claim 5, wherein the laser beam is third or more harmonics of a Nd:YAG laser or third or more harmonics of a Nd:YLF laser.

7. A method for fabricating a semiconductor device according to claim 1, further comprising between the step of forming the cover film and the step of disconnecting the fuse, a step of forming a polyimide film for relaxing a stress in assembly process, in the step of disconnecting the fuse, the cover film and the polyimide film being removed with disconnecting the fuse by laser ablation.

8. A method for fabricating a semiconductor device according to claim 1, wherein in the step of forming the blocking layer, the blocking layer including a tungsten film is formed.

9. A method for fabricating a semiconductor device according to claim 1, wherein in the step of forming the fuse, the fuse including a polycrystalline silicon film, an aluminum film or an aluminum alloy film is formed.

10. A method for fabricating a semiconductor device including a memory cell region where a plurality of memory cells are formed, and a fuse circuit region where a fuse circuit for replacing a defective memory cell by a redundant memory cell is formed, comprising the steps of:

forming a blocking layer over the base semiconductor substrate in the fuse circuit region, the blocking layer being for preventing the semiconductor substrate from ablating when a laser beam is irradiated;

forming an insulation film on the blocking layer;

forming a fuse on the insulation film, the fuse being formed of the same conducting layer as a conducting layer forming the memory cells or an interconnection layer formed in the memory cell region;

forming a cover film for covering the fuse; and disconnecting the fuse by laser ablation, the cover film being removed with disconnecting the fuse by laser ablation.

11. A method for fabricating a semiconductor device including a memory cell region where a plurality of memory cells are formed, and a fuse circuit region where a fuse circuit for replacing a defective memory cell by a redundant memory cell is formed, comprising the steps of:

forming a layer or layers over the base semiconductor substrate;

forming a fuse on the layer or layers, the fuse being formed of the same conducting layer as a conducting layer forming the memory cells or an interconnection layer formed in the memory cell region;

forming a cover film for covering the fuse; and disconnecting the fuse by laser ablation so as to stop the laser ablation at the layer or the layers, the cover film being removed with disconnecting the fuse by laser ablation.

12. A method for fabricating a semiconductor device comprising the steps of:

forming a first insulation film over a substrate;

forming a blocking layer including a tungsten film on the first insulation film, the blocking layer being for preventing the first insulation film and/or the substrate from ablating when a laser beam is irradiated;

forming a second insulation film on the blocking layer;

forming on the second insulation film a fuse including an aluminum film or an aluminum alloy film;

forming a cover film for covering the fuse; and disconnecting the fuse by laser ablation, the cover film being removed with disconnecting the fuse by laser ablation.

* * * * *